US010241500B2

(12) United States Patent
Rodegheri et al.

(10) Patent No.: US 10,241,500 B2
(45) Date of Patent: Mar. 26, 2019

(54) FILM TRANSDUCER AND ACTUATOR STRIP FOR A FILM TRANSDUCER

(71) Applicant: Buerkert Werke GmbH, Ingelfingen (DE)

(72) Inventors: Crícia De Carvalho Rodegheri, Mainz (DE); Marcel Konstandin, Karlsruhe (DE); Noam Nancy, Sélestat (FR); Peter Krippner, Karlsruhe (DE); Dieter Binz, Hirschberg an der Bergstrasse (DE); Ralf Scheibe, Kuenzelsau (DE)

(73) Assignee: Buerkert Werke GmbH, Ingelfingen (DE)

( * ) Notice: Subject to any disclaimer, the term of this patent is extended or adjusted under 35 U.S.C. 154(b) by 231 days.

(21) Appl. No.: 15/229,421

(22) Filed: Aug. 5, 2016

(65) Prior Publication Data
US 2017/0047868 A1 Feb. 16, 2017

(30) Foreign Application Priority Data

Aug. 10, 2015 (DE) .................. 10 2015 113 162

(51) Int. Cl.
*G05B 19/4099* (2006.01)
*F16K 31/02* (2006.01)
(Continued)

(52) U.S. Cl.
CPC ........ *G05B 19/4099* (2013.01); *F16K 31/025* (2013.01); *H01L 41/0472* (2013.01);
(Continued)

(58) Field of Classification Search
CPC ... H02N 99/00; H01L 41/0472; H01L 41/053; H01L 41/083; H01L 41/0831;
(Continued)

(56) References Cited

U.S. PATENT DOCUMENTS 4,739,929 A 4/1988 Brandner et al.
5,760,526 A * 6/1998 Anderson .............. H03H 9/059
310/313 R
(Continued)

FOREIGN PATENT DOCUMENTS

DE 3142684 A1 5/1983
DE 3532660 C2 5/1990
(Continued)

OTHER PUBLICATIONS

German Search Report dated Jul. 13, 2016 from corresponding German Application No. 10 2015 113 162.5, along with unofficial English translation, 10 pages.

*Primary Examiner* — John K Kim
(74) *Attorney, Agent, or Firm* — Dilworth IP, LLC

(57) ABSTRACT

A film transducer has a holding part and an electroactive multilayer composite structure including at least two deformable carriers which are each coated on at least one side with a planar electrode. The multilayer composite structure has an elongated basic shape and being clamped on its shorter sides in a fixing section in the holding part while its longer sides are free, the electrodes of the multilayer composite structure being alternately connected at the ends clamped in the holding part to a contact element which is arranged in the fixing section.

56 Claims, 14 Drawing Sheets

(51) Int. Cl.
  *H01L 41/047* (2006.01)
  *H01L 41/053* (2006.01)
  *H01L 41/083* (2006.01)
  *H01L 41/293* (2013.01)
  *H01L 41/193* (2006.01)

(52) U.S. Cl.
  CPC .......... *H01L 41/053* (2013.01); *H01L 41/083* (2013.01); *H01L 41/0831* (2013.01); *H01L 41/0833* (2013.01); *H01L 41/293* (2013.01); *G05B 2219/49023* (2013.01); *H01L 41/193* (2013.01)

(58) Field of Classification Search
  CPC ... H01L 41/0833; H01L 41/293; G06T 17/10; G05B 19/4099; G05B 2219/49023
  USPC .................................................. 310/300, 307
  See application file for complete search history.

(56) References Cited

U.S. PATENT DOCUMENTS

| | | | |
|---|---|---|---|
| 6,392,329 | B1 | 5/2002 | Bryant et al. |
| 2003/0076009 | A1* | 4/2003 | Hoffman ............... B06B 1/0603 310/332 |
| 2007/0205700 | A1* | 9/2007 | Okamura ............ F02M 51/0603 310/364 |
| 2007/0216257 | A1* | 9/2007 | Fujimura .............. B06B 1/0651 310/326 |
| 2009/0045695 | A1* | 2/2009 | Furue ................... H03H 9/0561 310/314 |
| 2009/0243441 | A1 | 10/2009 | Florian et al. |
| 2010/0043189 | A1* | 2/2010 | Fukano ................. H03H 9/059 29/25.35 |
| 2010/0289378 | A1 | 11/2010 | Blume et al. |
| 2010/0326405 | A1* | 12/2010 | Nakamura ........... H01L 41/0472 123/498 |
| 2011/0083714 | A1* | 4/2011 | Descure ................... H02N 2/18 136/239 |
| 2015/0123742 | A1* | 5/2015 | Naito ....................... H03H 9/17 331/158 |
| 2015/0155474 | A1* | 6/2015 | Tanimoto ............... H01L 41/083 310/332 |
| 2017/0047868 | A1* | 2/2017 | Rodegheri .......... G05B 19/4099 |

FOREIGN PATENT DOCUMENTS

| | | |
|---|---|---|
| DE | 10017760 C1 | 8/2001 |
| DE | 10246307 A1 | 4/2004 |
| DE | 102005017108 A1 | 7/2006 |
| DE | 102008007034 A1 | 8/2009 |
| WO | 2009033949 A1 | 3/2009 |

* cited by examiner

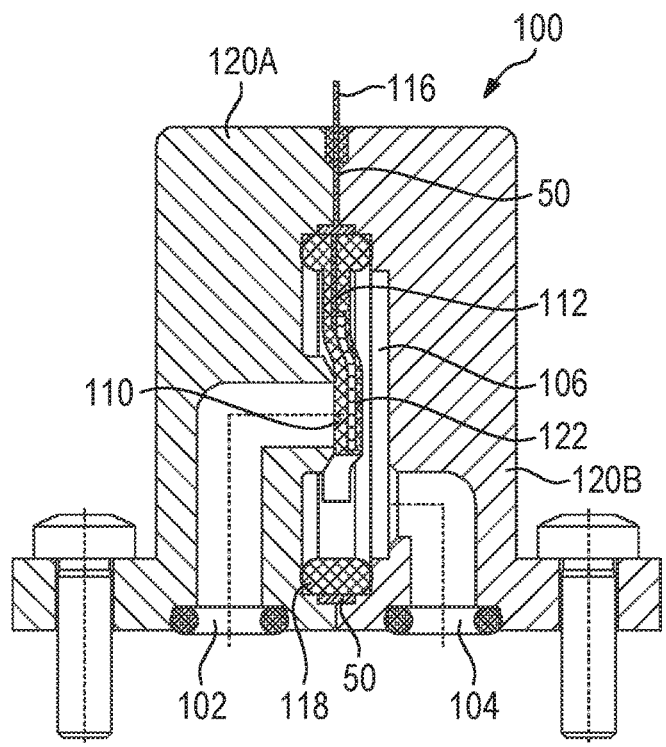
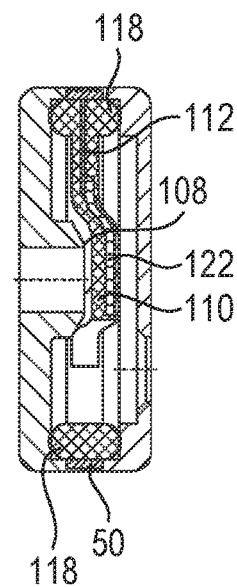
Fig. 27  Fig. 28
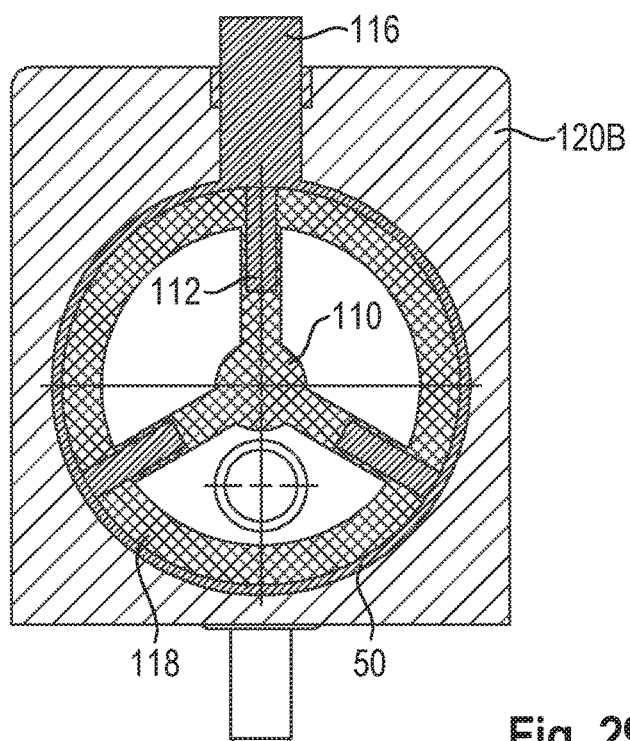
Fig. 29

FILM TRANSDUCER AND ACTUATOR STRIP FOR A FILM TRANSDUCER

FIELD OF THE INVENTION

The invention relates to a film transducer and to an actuator strip for a film transducer.

BACKGROUND OF THE INVENTION

The film transducer can be used for converting electrical energy to mechanical work. It is, for example, known to utilize it as an actuator.

A film transducer includes an electroactive composite structure which, in simplified terms, consists of an elastically deformable dielectric medium in the form of a thin film which serves as a carrier for the two electrodes. The electrodes are mounted to the top and bottom sides of the film. When an electric field is generated between the two electrodes, an attractive force is produced between the electrodes, so that they seek to reduce the distance between them. This causes the carrier to be pressed together. Since the material of the carrier is essentially incompressible, a reduction in thickness of the carrier results in an increase in its length. This may generate a stroke of the load application member, for instance when it is urged into a specific direction by a spring.

In the prior art, the holding part is usually in the form of a closed ring or frame enclosing the composite structure on all sides. In a top view, for example, this frame and the carrier may have a circular shape or a rectangular shape. It has been found that this is not an optimum shape for the holding part for various applications.

It is the object of the invention to improve the known film transducer in such a way as to produce a better adjustment behavior of the load application member.

BRIEF DESCRIPTION OF THE INVENTION

To achieve this object, the invention provides a film transducer having a holding part, an electroactive multilayer composite structure including at least one and preferably a plurality of deformable carriers which are each coated on at least one side with a planar electrode, the multilayer composite structure having an elongated rectangular basic shape and being clamped on its shorter sides in a fixing section in the holding part while its longer sides are free, the electrodes of the multilayer composite structure being alternately connected at the ends clamped in the holding part to a contact element which is arranged in the fixing section. The invention is based on the fundamental idea of using a strip-shaped composite structure which includes a plurality of layers of carriers and electrodes, stacked on top of one another. Since the multilayer composite structure is fixed in the holding part only at the two ends facing away from each other, in particular the center section of the strip located between these two ends can deform very well as the longer sides can move without being impaired by the holding part. A further advantage resides in that the film transducer is narrow in design and is therefore especially well-suited for applications in which little space is available.

Preferably, the fixing section has a spring element arranged therein by which the ends clamped there of the multilayer composite structure are pressed together. The spring element provides for an elastic preload, so that the composite structure will remain reliably clamped in the fixing section even in the case of motion phenomena and any settling phenomena possibly occurring.

It is preferably provided for that the contact element is a contact blade which is inserted in a recess in the holding part. The contact blade can be used for reliably contacting the electrodes after the composite structure has been fixed in place in the fixing sections.

With a view to an optimum efficiency, the electrodes are contacted alternately in one and in the other fixing section. This results in a particularly space-saving structure when viewed in the stacking direction since, rather than using two electrodes per carrier, the electrodes arranged within the multilayer composite structure act for both the carrier positioned above and the carrier positioned below. It is therefore possible either to use just as many electrodes as carriers (in that case one carrier is exposed on one of the outsides of the multilayer composite structure and can not be activated), or to use exactly one electrode more than there are carriers.

According to one configuration of the invention, provision is made that the ends of the multilayer composite structure, which are clamped in the fixing section of the holding part, are bent as compared to their direction of extent between the two fixing sections. The electrodes thereby extend approximately perpendicularly to the plane of the carrier, so that a large surface for contacting the electrodes is available on the outside of the multilayer composite structure.

Here, the electrodes are preferably arranged on that side of the carrier which, after the bending process, is associated with the contact element. The latter may extend outside the multilayer composite structure, so that the carriers will not get mechanically damaged, nor need to be pierced.

According to one configuration, it is provided that the electrodes extend as far as to the edge of the carrier at one end of the multilayer composite structure and terminate at a distance from the edge at the opposite end. This design ensures that the electrodes are contacted alternately.

According to one configuration of the invention, provision is made that the carriers are provided with a contact tongue which is coated with the electrode. The contact tongues may be arranged in a position that is advantageous to the contacting.

It is possible here that, in a top view, the contact tongues are arranged in a stepped configuration. This allows the bent contact tongues to be arranged laterally next to each other, so that no excessively thick package of contact tongues is produced which would be difficult to bend.

According to one configuration of the invention, it is provided that the carriers of the multilayer composite structure have different lengths and are layered such that their ends, in a top view, are arranged in a stepped configuration. This also allows to prevent that when the ends of the carriers coated with the electrodes are bent over, a thick package is generated that is difficult to handle.

Provision may also be made that the electrodes are provided with a contact tab which is contacted in the associated fixing section. This is expedient when it is desirable to have a larger amount of material for contacting purposes, for example if the contact tabs are to be soldered to each other.

A conductive adhesive may also be used, by which the electrodes are electrically conductively bonded to each other.

Preferably, an electronic circuit is provided which is connected to the contact elements. In this way, an integrated component can be manufactured which, apart from an energy supply and a data line, is self-sufficient.

The electronic circuit may be integrated in the holding part, for example suitably cast, so that it is well protected.

According to a preferred embodiment of the invention, a mounting plate is provided to which the holding part is attached. The mounting plate serves as a stiffening and/or as a cover for the film transducer, so that the film transducer is well protected and can be reliably mounted.

The electronic circuit may also be attached to or integrated in the mounting plate, so that it is well protected.

Preferably, a spring element is arranged between the mounting plate and the load application member. The spring element acts upon the multilayer composite structure in a direction of deflection, so that the stroke direction of the film transducer is precisely defined.

The multilayer composite structure may have a load application member arranged thereon between the fixing sections. Forces may be introduced into or removed from the multilayer composite structure at the load application member, the load application member ensuring that the multilayer composite structure does not get damaged.

The load application member may be a plate or a tappet.

With a view to a compact design, provision is made that the tappet extends through the mounting plate and through the spring element. The tappet may also have a cup-shaped design and may receive the spring element in its interior.

According to one configuration, it is provided for that the load application member is a slide which is displaceably guided in the holding part and against which the spring element is supported. In this configuration, the multilayer composite structure is guided in a lateral direction.

According to one configuration of the invention, it is provided for that the holding part consists of a material which has a higher hardness than the multilayer composite structure. With the forces occurring, the holding part may therefore be regarded as being rigid.

The carrier is preferably a dielectric material, in particular a dielectric polymer. The latter stands out due to a high deformability.

Suitable materials for the carrier are a sheet or a film made from a polymer, e.g., a silicone, acrylate or PU.

Provision may be made here that the dielectric material is a printed component which has been produced as a thin film in particular by a screen printing process, a pad printing process or a 3D printing process. Using such processes, the carrier can be produced in a flexible manner and so as to have the respectively desired dimensions.

The dielectric material may also be a cast component which has been produced as a spin coating, for example.

The electrodes arranged on the carriers may consist of a mixture of a matrix material, a conductive material, solvents and additives. This ensures that the electrodes have a good deformability.

The matrix material used for the electrodes may be an elastomer material, for example silicone, acrylate or PU. These materials stand out for being highly deformable and having a good aging resistance.

The conductive material for the electrodes may be soot, carbon nanotubes, conductive polymers, nanowires or a mixture of these materials. When they are embedded in the matrix material, these materials ensure a high electrical conductivity, accompanied by good deformability.

According to one configuration of the invention, it is provided for that the electrodes are a printed component which has been applied as a thin layer in particular by screen printing processes, pad printing processes, 3D printing processes, lamination, inkjet printing processes or aerosol jet processes. These processes allow the electrodes to be arranged on the carrier in the respectively desired geometry with little effort.

It is also possible for the electrode to be produced separately and then to be bonded to the carrier.

The film transducer may be used for converting electrical energy to mechanical work. In this case, it acts as an actuator.

It is also feasible to use the film transducer for converting mechanical to electrical energy. Here, the distance of the electrodes from each other will change when the load application member is moved from the outside. Similar to a charged capacitor, in which the distance of the capacitor plates from each other is changed, in the case of the film transducer the voltage between the electrodes will change. This means that the film transducer may be employed similar to a sensor or a generator.

The holding part may be a printed component, which is manufactured, for example, by a screen printing process, a pad printing process or a 3D printing process. This allows different geometries to be flexibly produced, depending on the specific application.

The holding part may also be an injection molded part, which can be produced in large numbers at low cost.

In particular, epoxy resin is a suitable material for the holding part.

According to one embodiment of the invention, provision is made that the multilayer composite structure is tautly mounted in the holding part, like in a trampoline. That is, the multilayer composite structure carries out a stroke which is substantially perpendicular to its direction of extent and thus also perpendicular to its direction of expansion. Altogether, this results in a small overall height.

According to an alternative embodiment, provision is made that the multilayer composite structure extends in a loop-like manner. In other words, the multilayer composite structure sags (even though it may be taut) between the fixing sections, that is, it extends away from the plane that runs through the two fixing sections. As a result, the direction of expansion of the multilayer composite structure coincides with the stroke direction, so that larger strokes can be realized. In addition, the overall width of the actuator is reduced.

According to a preferred embodiment, provision is made that the multilayer composite structure is provided with an actuating section in the center. The actuating section can cooperate with a valve seat and, depending on the state of activation of the film transducer, may close or expose the valve seat.

Preferably, it is provided here that the actuating section is free of electrodes. Electrodes are only provided in those sections which are utilized for a change in length of the actuator.

Provision is made according to one configuration that the holding part is a ring. This allows a multilayer composite structure to be uniformly clamped which does not consist of one single strip extending in a straight line, but features more complex shapes.

In particular, the multilayer composite structure may be star-shaped, for example having three sections extending outward equidistantly from the actuating section. This allows the actuating force to be raised while the actuating section is acted upon uniformly.

The invention also relates to an actuator strip for a film transducer as has been described above, the actuator strip including a carrier which consists of an elastically deformable plastic film and, in a top view, has a generally elongated rectangular shape, and a planar electrode which is firmly connected to the carrier and forms a contacting section on one of the two shorter side edges of the carrier. Such an actuator strip may be used for producing a multilayer composite structure with little effort in that the individual strips are bonded to each other or laminated on top of each other. Similarly to the film transducer, "rectangular" in this connection more particularly means that there are two longer side edges and two shorter side edges. For example, the length of the longer side edges is at least twice the length of the shorter side edges. "Rectangular" does not necessarily mean that it is absolutely necessary for the composite structure to have straight side edges and/or corners. The composite structure may have a "boat shape", a kidney shape, etc.

To facilitate the contacting, the contacting section may include a contact tab projecting in the longitudinal direction.

It may also be provided for that the contacting section is a contact tongue which is electrically conductively connected to the electrode. This allows the contact tongues to be soldered to each other.

The carrier preferably consists of a dielectric polymer, so that it is readily deformable.

The electrode preferably consists of an elastic, electrically conductive plastic. It is therefore just as well deformable as the carrier, so that an actuator strip is formed which, as a whole, has a very good elastic deformability.

To achieve the above-mentioned object, according to the invention provision is also made for a method of contacting the electrodes of a multilayer composite structure for manufacturing a film transducer, wherein at least one actuator strip is arranged in a holding part such that it projects by a contacting section over a fixing section of the holding part. Subsequently, the contacting section is bent over, as against the orientation of the actuator strip between the fixing sections, and the contacting section is contacted. In this way, a large number of actuator strips in a composite structure can be reliably contacted with little effort.

Preferably, a plurality of actuator strips are stacked, the contacting sections being located alternately on opposite sides of the composite structure. In that case, it is not required that each actuator strip be contacted separately, but all "odd" actuator strips on one side and all "even" actuator strips on the other side are each brought to one and the same potential.

Various methods are suitable for contacting. It may be provided for that for contacting, a contact blade is inserted which contacts all of the contacting sections located on the respective side of the holding part. It may also be provided for that the contacting sections are contacted by means of an electrically conductive adhesive. As an alternative, the contacting sections may be soldered to each other.

BRIEF DESCRIPTION OF THE DRAWINGS

The invention will now be described below with reference to various embodiments which are illustrated in the accompanying drawings, in which:

FIG. 27 shows a section taken along the plane XXVII-XXVII of FIG. 26, the valve being in the closed state;

FIG. 28 shows a cutout from FIG. 27, the valve being in an open state;

FIG. 29 shows a section taken along the plane XXVIII-XXVIII of FIG. 26,

DETAILED DESCRIPTION OF THE INVENTION

Figure 1:
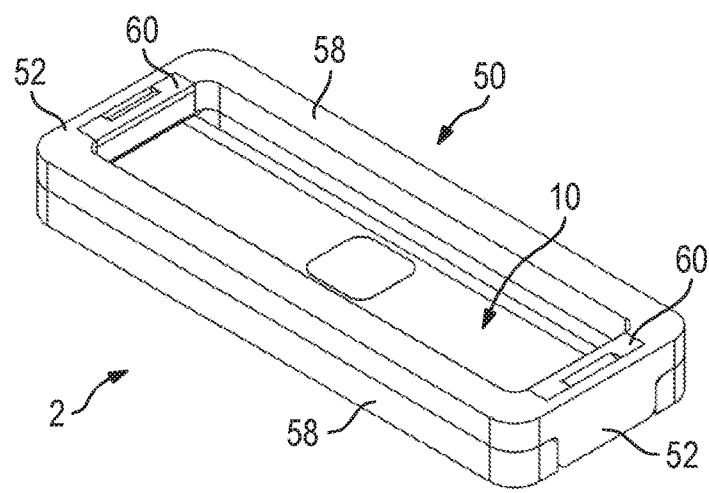
FIG. 1 shows a perspective view of a film transducer according to a first embodiment of the invention.
Figure 2:
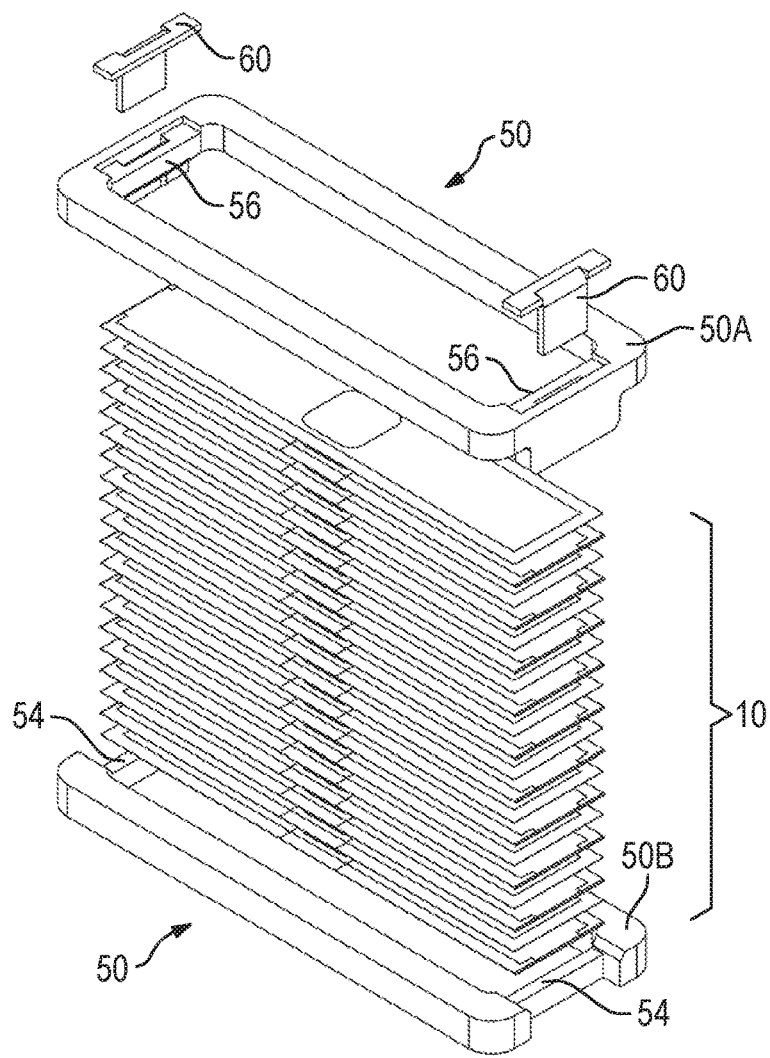
FIG. 2 shows a perspective exploded view of the film transducer of FIG. 1.

FIGS. 1 to 9 show a film transducer 2 according to a first embodiment. It contains a multilayer composite structure 10 and a holding part 50.

The multilayer composite structure 10 is a stack of carriers 12 and planar electrodes 14, arranged in alternation.

Each carrier 12 (see in particular FIGS. 5 and 6) has an elongated, rectangular basic shape. It consists of a sheet or a film made from an elastically deformable, dielectric material.

The elastically deformable, dielectric material more particularly is an electroactive polymer, silicone, acrylate or PU.

The planar electrode 14 is elastically deformable in the same manner as the carrier 12. Basically, it is possible to manufacture the electrode separately from the carrier and then to connect it with the carrier, for example by gluing or laminating it on. Preferably, however, the electrode 14 is realized as a coating on the carrier, for example by directly printing it on.

The electrodes consist of a matrix material, for example silicone, acrylate or PU, which is provided with a conductive material, for example soot, carbon nanotubes, conductive polymers, nanowires or a mixture of these materials.

Figure 5:
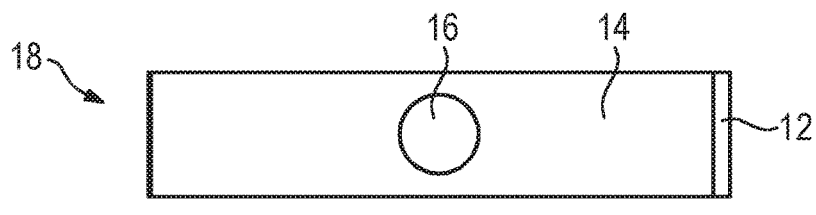
FIG. 5 shows a top view of a first type of carrier provided with an electrode, which is used in the film transducer of FIG. 1.
Figure 6:
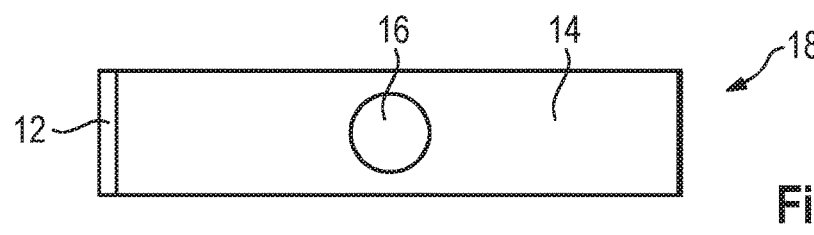
FIG. 6 shows a top view of a second type of carrier.
Figure 7:
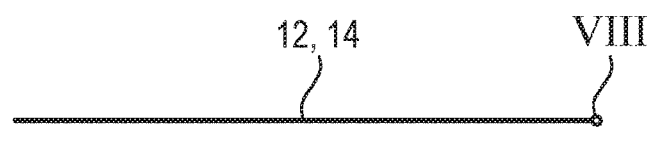
FIG. 7 shows a side view of the carrier of FIG. 6.
Figure 8:
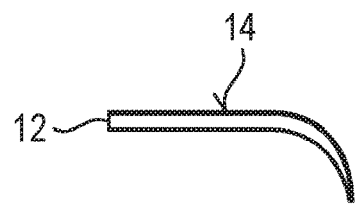
FIG. 8 shows detail VIII of FIG. 7.
Figure 9:
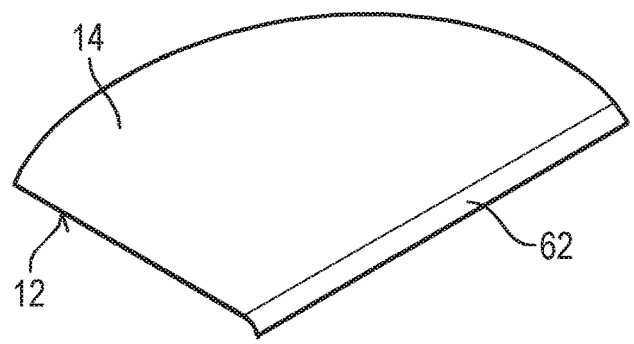
FIG. 9 shows a perspective view of detail VIII of FIG. 7.

As can be seen in particular from FIGS. 5 and 6, there are two different types of carriers. In the first type as shown in FIG. 5, the electrode 14 extends as far as onto the left edge of the carrier while the right edge is left free. In the second type, shown in FIG. 6, it is just the opposite: the electrode extends as far as to the right edge of the carrier 12 while the left edge remains free.

The types of carriers coated with electrodes as shown in FIGS. 5 and 6 in fact only differ with regard to their orientation in the film transducer 2; actually, they are geometrically identical here.

Each carrier 12 provided with an electrode 14 is provided with a load application member 16, which may later serve to introduce a force into or remove a force from the multilayer composite structure 10. The load application member 16 may be configured either as a small reinforcement plate formed on the carrier 12 or the electrode 14 or it may consist of a region that is not coated (with electrodes) or else of an opening through which a fastening element extends which connects two external plates with each other between which the multilayer composite structure 10 is clamped.

The multilayer composite structure 10 consists of a larger number of carriers 12 provided with electrodes 14, with the first and second types being disposed alternately.

It may be provided for that the carriers 12 coated with the electrodes 14 are arranged so as to be alternately slightly shifted in relation to each other as viewed in their longitudinal direction, so that on each side the shorter side edges of the rectangular carrier in which the electrodes 14 extend as far as to the outermost edge of the carrier 12 project farther from the stack formed.

The carriers 12 provided with the electrodes 14 may be manufactured as separate actuator strips 18, which are subsequently connected with each other to form the multilayer composite structure. For this purpose, they may be bonded to each other or laminated on top of each other. It is also feasible to print the carriers and the electrodes layer by layer and in this way to produce the multilayer composite structure 10 in layers.

The composite structure 10 is clamped within the holding part 50. The holding part 50 is designed like an oblong frame which here consists of an upper part 50A and a lower part 50B.

The holding part 50 includes a fixing section 52 on each of its shorter side edges, which serves to mechanically clamp and hold the shorter side edges of the multilayer composite structure 10. To this end, the lower part 50B has an abutment 54 provided therein against which the outer edges of the multilayer composite structure 10 are pressed by the upper part 50A.

The upper part 50A is provided with two spring elements 56 here, which elastically press the stack of films of the multilayer composite structure 10 against the abutments 54. The spring elements may be formed by spring shackles formed in one piece with the upper part 50A or by a slide that is acted upon by separate springs.

The two fixing sections 52 of the holding part 50 are connected with each other by two connecting sections 58 which extend along the longer side edges of the multilayer composite structure 10.

Figure 3:
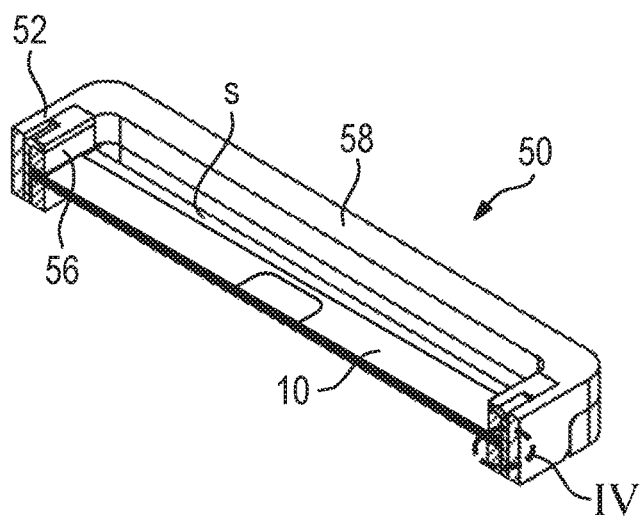
FIG. 3 shows a sectional perspective view of the film transducer of FIG. 1.

As can be seen in particular in FIG. 3, this means that the multilayer composite structure is held taut between the fixing sections 52 of the holding part 50 in the longitudinal direction while it is exposed laterally (that is, along the longer side edges) (see gap s between the longer side edges of the composite structure 10 and the connecting sections 58 of the holding part 50).

The electrodes 14 of the multilayer composite structure 10 are electrically contacted alternately on opposite sides of the holding part 50, i.e. the electrodes 1, 3, 5, . . . , for example, on the fixing section 52 arranged on the right in FIG. 1 and the electrodes 2, 4, 6, 8, . . . on the fixing section 52 arranged on the left in FIG. 1.

Contact elements 60 (see in particular FIG. 2) are used for contacting here, which are inserted into a retainer in the fixing section 52 and electrically contact the electrodes located there. In the process, the carriers 12 with the electrodes 14 located thereon are bent (see in particular FIGS. 4 and 8), so that it is not the external front face of the actuator strip made up of the carrier and the electrode that faces the contact element but, rather, the "top side", i.e. the electrode. This ensures that the electrode is contacted over a large area.

The contact elements 60 are in the form of contact blades here.

The bent end section of each actuator strip formed of the carrier 12 and the electrode 14 thus constitutes a contacting section 62.

For driving the film transducer an electronic circuit is made use of, which may be integrated in the holding part, for example. This circuit is connected to the contact elements 60, so that a desired electric potential can be produced between the contact elements 60.

Figure 10:
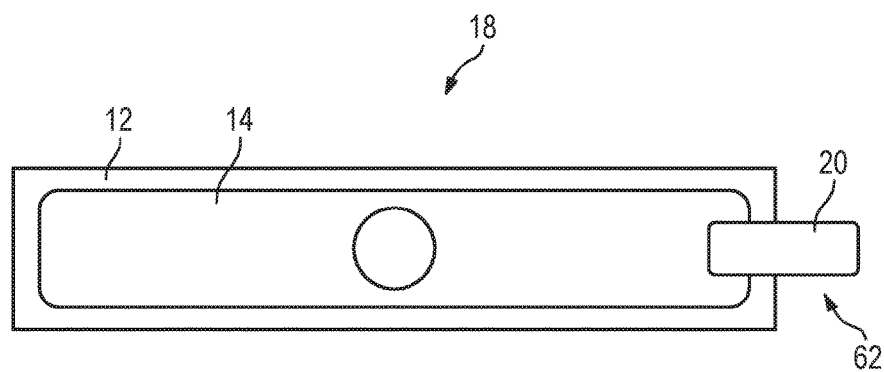
FIG. 10 shows a top view of a carrier provided with an electrode, according to a first embodiment variant.

FIG. 10 illustrates an embodiment variant of the actuator strip 18 shown in FIGS. 5 and 6.

The difference from the actuator strips of FIGS. 5 and 6 resides in that in the embodiment variant shown in FIG. 10, a contact tab 20 is used which is a separate component that is mounted to the actuator strip 18, more specifically such that it is electrically conductively connected to the electrode 14.

The contact tab 20 projects over the carrier 12 at one of the shorter side edges thereof.

The contact tab 20 may be made of a thin metal sheet. This provides a sufficient amount of material for soldering all contact tabs arranged on one side to each other once they are bent onto each other.

Basically, the electrode 14 may cover the entire surface of the carrier 12. As can be seen in FIG. 10, however, it may also terminate at a distance from the outer edges of the carrier.

Figure 11:
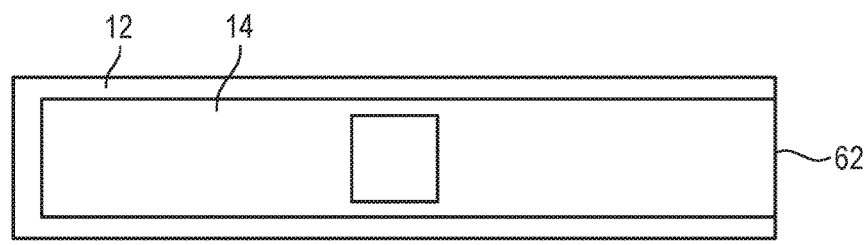
FIG. 11 shows a top view of a carrier provided with an electrode, according to a second embodiment variant.

FIG. 11 shows a second embodiment variant. It differs from the variant known from FIGS. 5 and 6 in that the electrode 14 terminates at a distance from the carrier 12 on three of the four side edges thereof, that is, the carrier is exposed there, whereas the electrode extends as far as to the outer edge of the carrier 12 exclusively on that side edge on which the contacting section 62 is formed.

Figure 12:
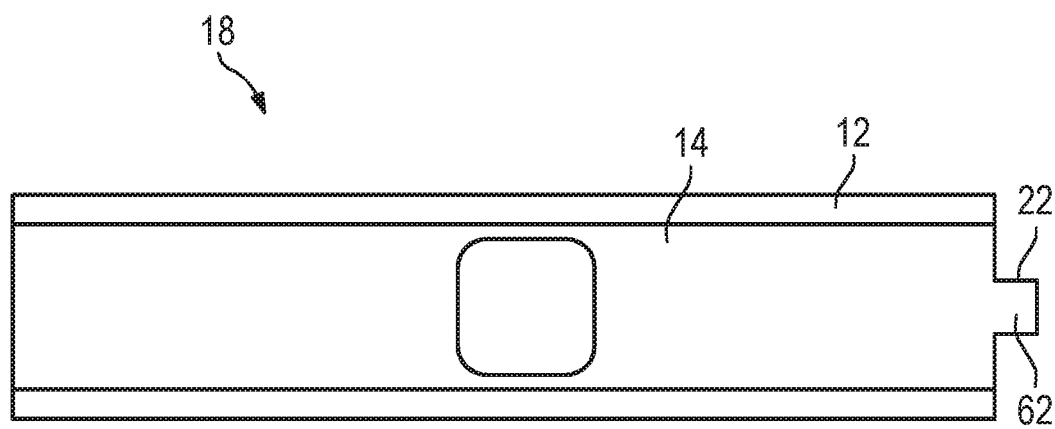
FIG. 12 shows a top view of a carrier provided with an electrode, according to a third embodiment variant.

FIG. 12 shows a further embodiment variant.

The essential feature of the actuator strip 18 shown in FIG. 12 consists in that the contacting section 62 is formed by a contact tongue 22 which protrudes in the longitudinal direction on one of the shorter side edges of the actuator strip 18.

Figure 4:
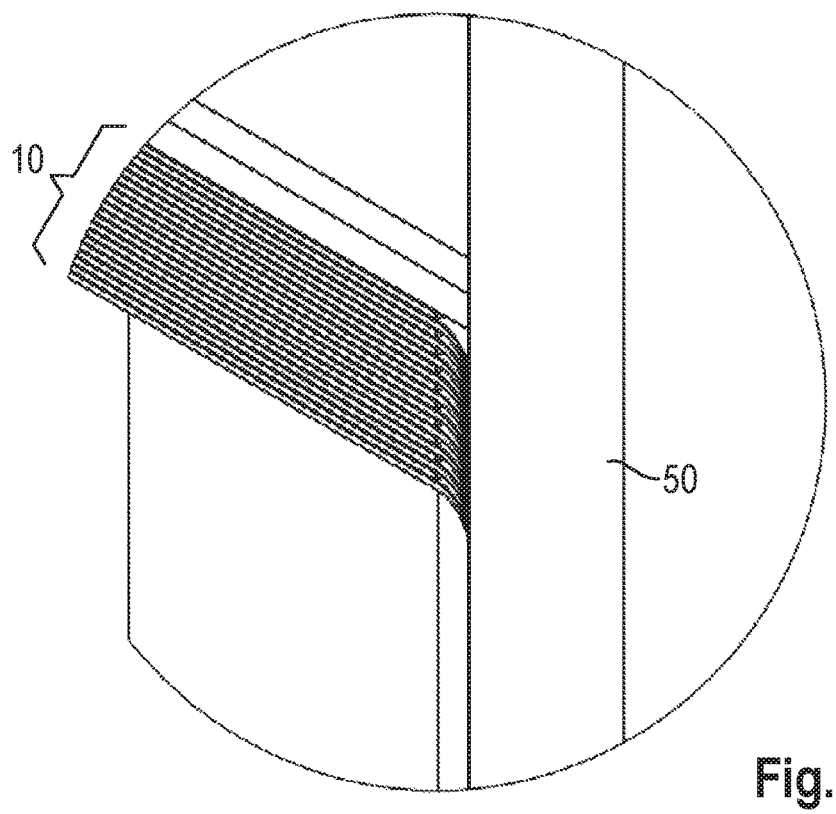
FIG. 4 shows detail IV of FIG. 3.
Figure 13:
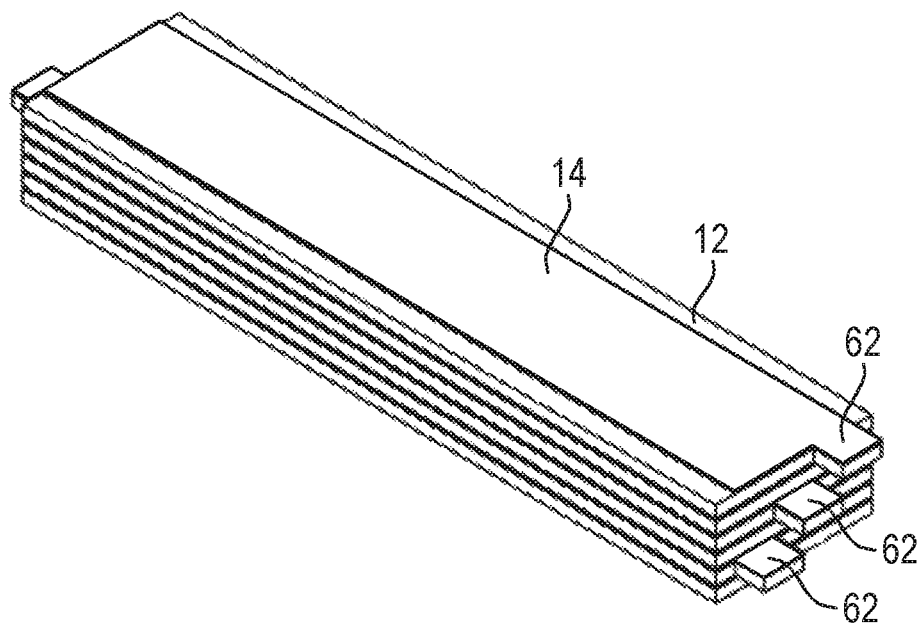
FIG. 13 shows a multilayer composite structure that is formed of different variants of the embodiment variant shown in FIG. 12.

The contact tongues 22 may be arranged at different positions as viewed in the transverse direction of the actuator strip 18 (see FIG. 13), such as, e.g., on the outer edge, in the middle, and on the opposite outer edge. This stepped arrangement results in that not all of the contacting sections 62 lie above one another, as can be seen in FIG. 4, but they lie next to each other, so that they can be contacted separately by the contact element 60.

Figure 14:
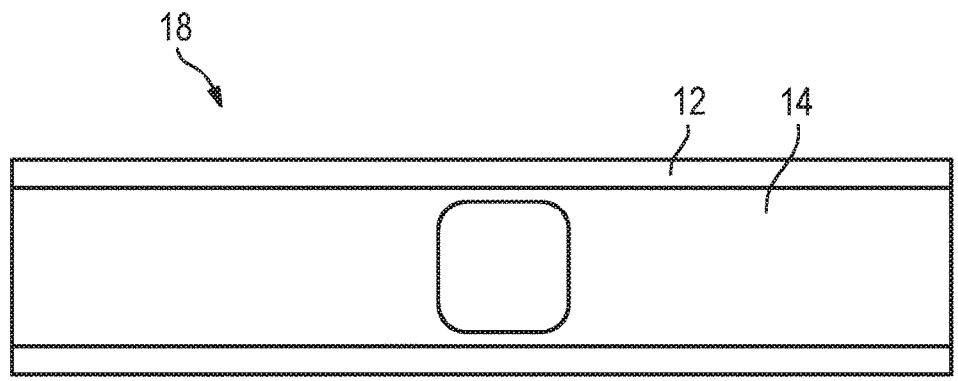
FIG. 14 shows a top view of a carrier provided with an electrode, according to a fourth embodiment variant.

FIG. 14 shows a further embodiment variant of the actuator strip 18. In this variant, the electrode 14 extends as far as directly to the shorter outer edges of the rectangular, strip-shaped carrier 12.

When the actuator strips 18 of the embodiment variant shown in FIG. 14 are layered so as to be offset in relation to each other as viewed in the longitudinal direction, on each side every other electrode will be exposed such that it can be contacted.

Figure 15:
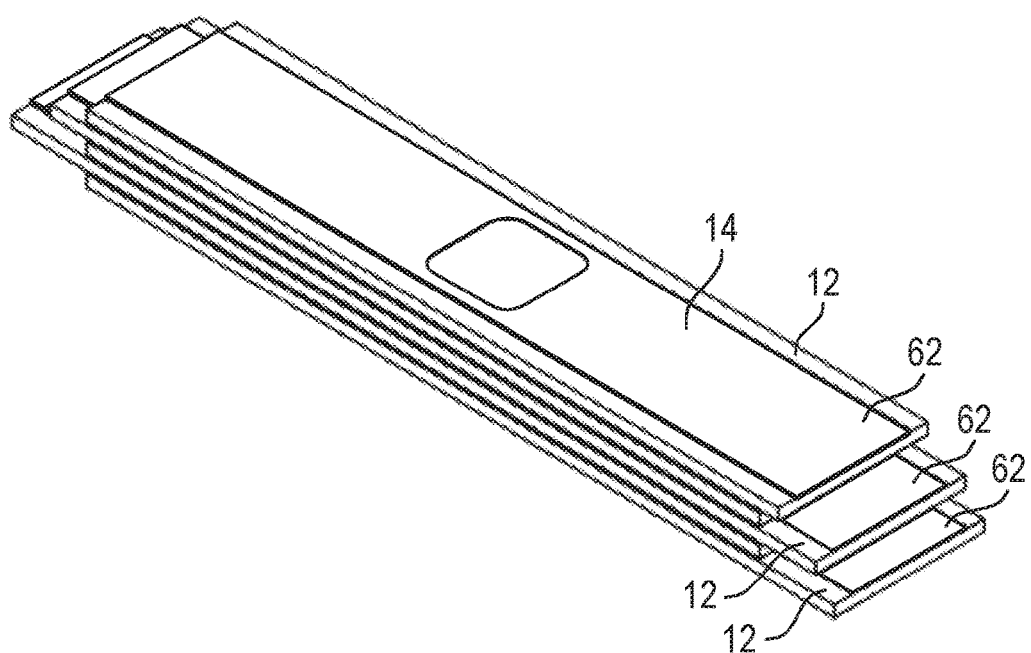
FIG. 15 shows a multilayer composite structure that is formed of different variants of the embodiment variant shown in FIG. 14.

In addition, it may be provided for that the actuator strips 18 are configured to have different lengths, more particularly lengths that increase stepwise. In this way, the multilayer composite structure 10 shown in FIG. 15 is obtained, in which the contacting sections 62 are exposed in steps, which allows them to be contacted particularly well.

Figure 16:
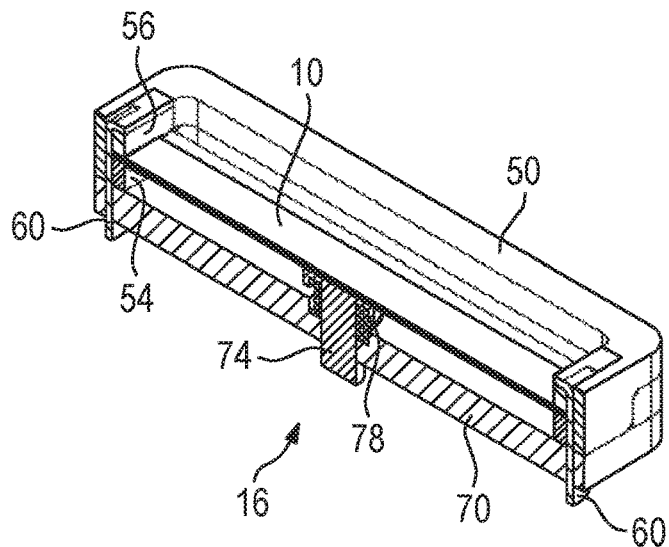
FIG. 16 shows a perspective sectional view of a film transducer according to a second embodiment.
Figure 17:
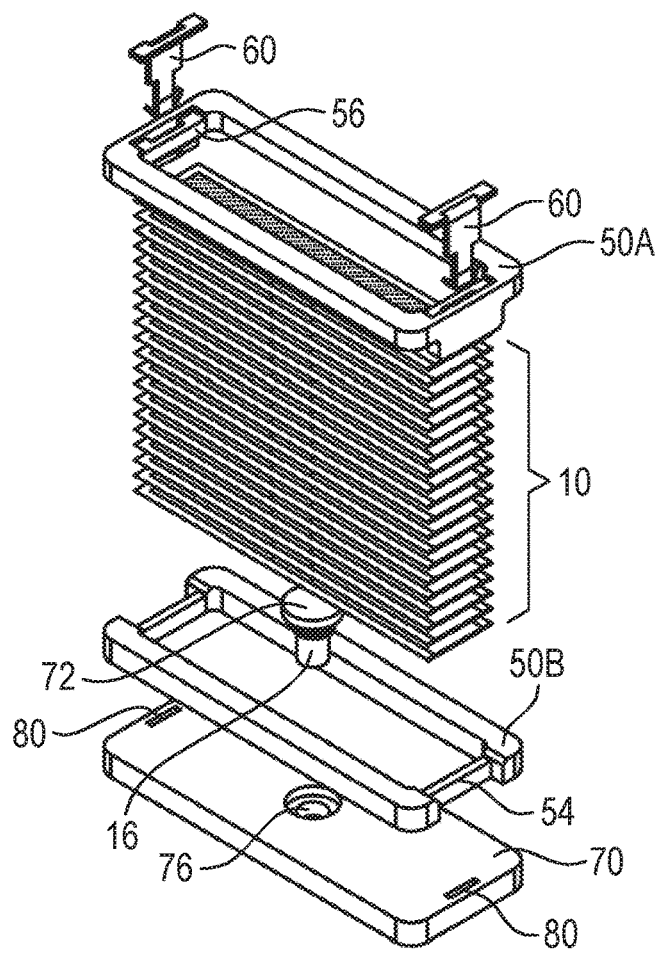
FIG. 17 shows a perspective exploded view of the film transducer of FIG. 16.
Figure 18:
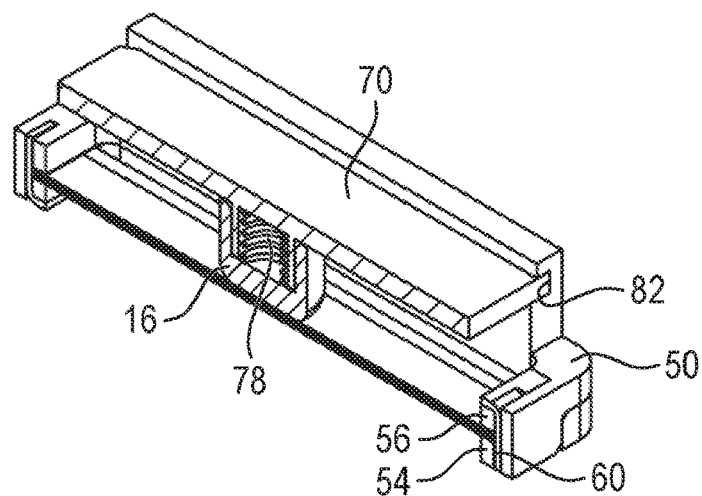
FIG. 18 shows a perspective sectional view of a film transducer according to a third embodiment of the invention.
Figure 19:
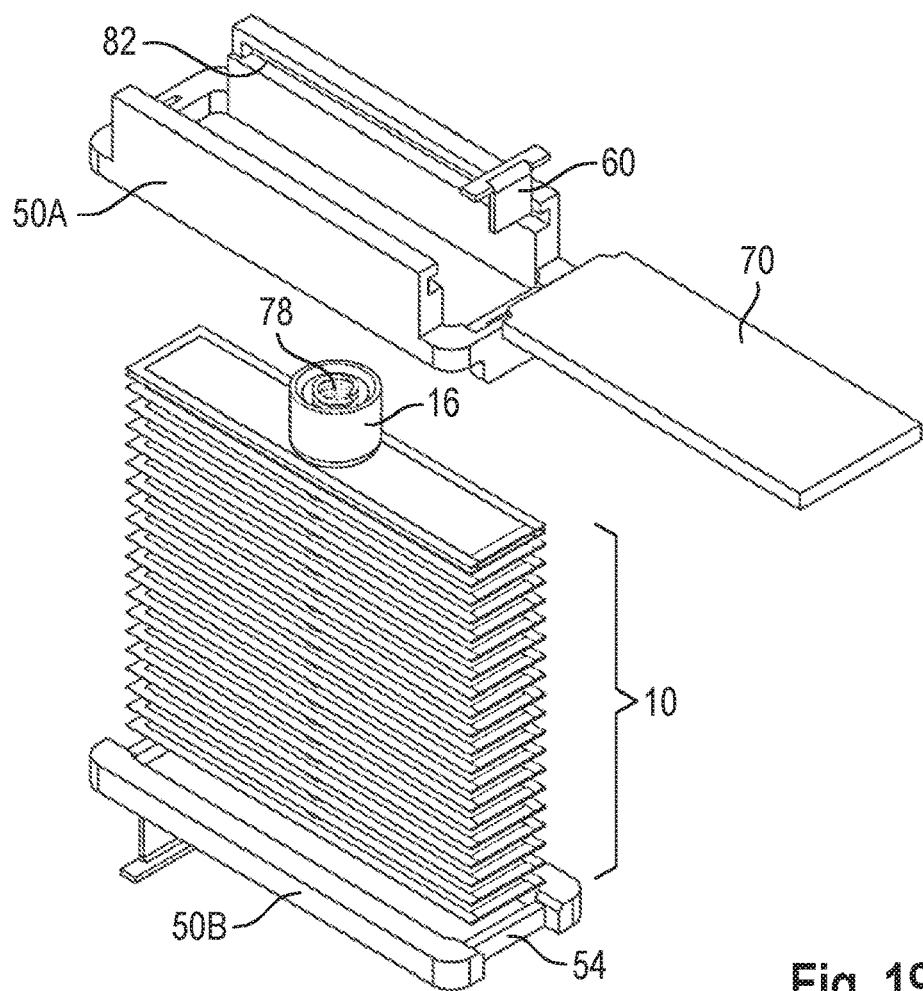
FIG. 19 shows an exploded view of the film transducer of FIG. 18.

FIGS. 16 and 17 show an embodiment of the film transducer in which it is realized as an actuator.

The same reference numbers are used for the components known from the first embodiment, and reference is made to the above discussions in this respect.

A mounting plate 70 is provided on which the holding part 50 is mounted.

The load application member 16 is in the form of a tappet here, which has a head 72 that rests against the side of the multilayer composite structure 10 facing the mounting plate 70. A stem 74 of the load application member 16 extends through an opening 76 of the mounting plate 70, so that the face side of the tappet is exposed on the side of the mounting plate 70 facing away from the holding part 50.

Arranged between the head 72 of the tappet and the mounting plate 70 is a spring element 78 which takes the form of a spiral spring here and is arranged on the tappet stem 74.

The mounting plate 70 may also be provided with the electronic circuit for driving the film transducer. Here, the mounting plate 70 preferably has electrical conductor tracks arranged inside, by means of which the contact elements 60 can be electrically contacted. For this purpose, the contact elements 60 extend into suitable recesses 80 of the mounting plate 70.

In an initial state, the tappet 16 is roughly in the position shown in FIG. 16. When the film transducer 2 is driven, that is, an electric potential is generated between the contact elements 60, the carriers 12 between the electrodes 14 are slightly pressed together, which causes the actuator strip 18 to become longer. This allows the spring element 78 to displace the tappet 16 upward as related to FIG. 16.

If no (or a lower) electric potential is applied between the contact elements 60, the actuator strips 18 become shorter again, so that, contrary to the effect of the spring element 78, the tappet 16 is adjusted toward the initial position.

FIGS. 18 to 21 show a third embodiment, in which the film transducer 2 is part of an actuator.

The same reference numbers are used for the components known from the preceding embodiments, and reference is made to the above discussions in this respect.

The difference between the second and third embodiments in general terms consists in that in the third embodiment, the load application member 16 is arranged entirely between the mounting plate 70 and the multilayer composite structure 10.

In the third embodiment, the mounting plate 70 is inserted in a sliding guide 82 which is integrated in the upper part 50A of the holding part 50. On its side facing the composite structure 10, the mounting plate 70 includes a sleeve-shaped guide 84 inside which the spring element 78 is arranged, which, here again, is in the form of a spiral compression spring.

The load application member 16, which is in the form of a cup-shaped tappet here, is guided on the guide 84. The tappet 16 is pressed against the multilayer composite structure 10 by the spring element 78 (see in particular FIGS. 20 and 21).

In the initial state (see FIG. 20) the multilayer composite structure 10 is held comparatively taut between the two fixing sections 52 of the holding part 50, comparable to the jumping mat of a trampoline. The spring element 78 is thus preloaded to a greater degree.

Figure 21:
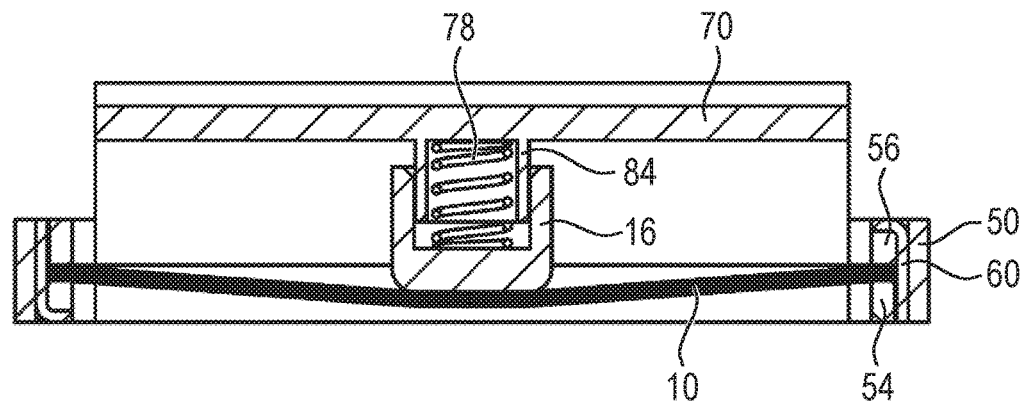
FIG. 21 shows a longitudinal section of the film transducer of FIG. 18 in the activated state.

When an electric potential acts between the first and the second electrodes, the actuator strips 18 of the multilayer composite structure 10 will lengthen, so that the spring element 78 is able to urge the tappet 16 away from the mounting plate 70 (see FIG. 21).

Figure 20:
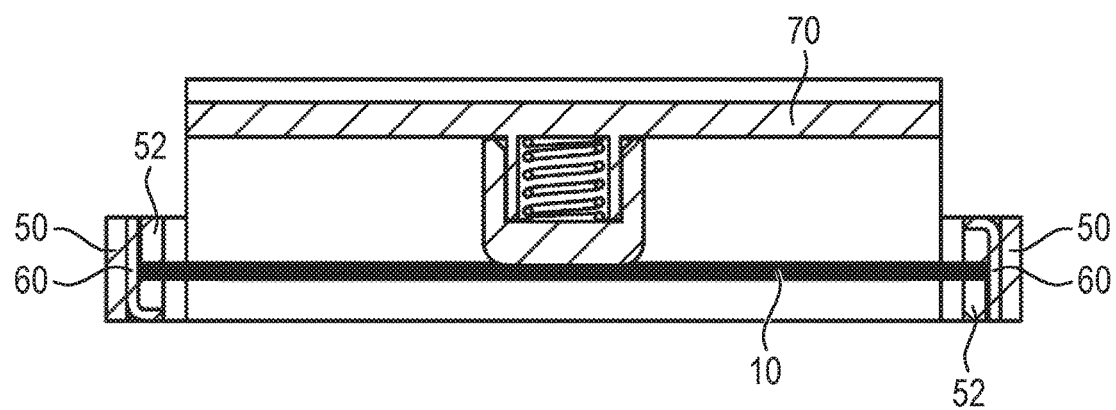
FIG. 20 shows a longitudinal section of the film transducer of FIG. 18 in the non-activated state.

When the potential is removed again, the tappet will return to the initial state shown in FIG. 20 under the action of the multilayer composite structure 10.

The stroke of the tappet 16 can be utilized directly in that the side of the multilayer composite structure 10 facing away from the tappet 16 cooperates directly with a valve seat, so that the latter is closed or opened. As an alternative, a further load application member may either be firmly attached or be in spring-loaded contact on the side of the multilayer composite structure 10 facing away from the tappet 16, so that the stroke is made use of for the actuation required in the respective application.

Figure 22:
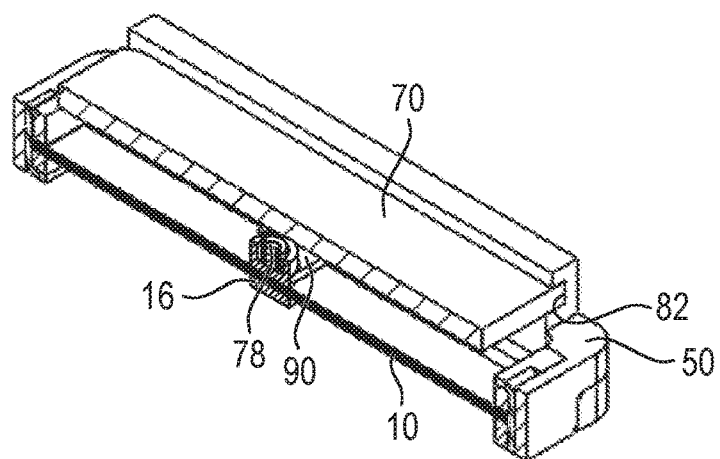
FIG. 22 shows a perspective sectional view of a film transducer according to a fourth embodiment of the invention.
Figure 23:
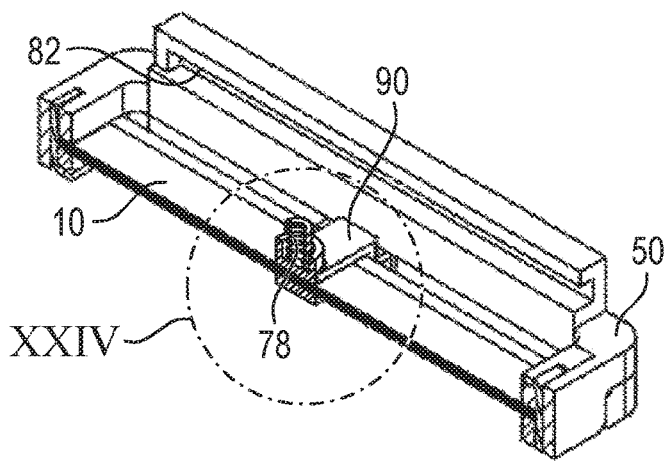
FIG. 23 shows the film transducer of FIG. 22, with a mounting plate not being shown for greater clarity.
Figure 24:
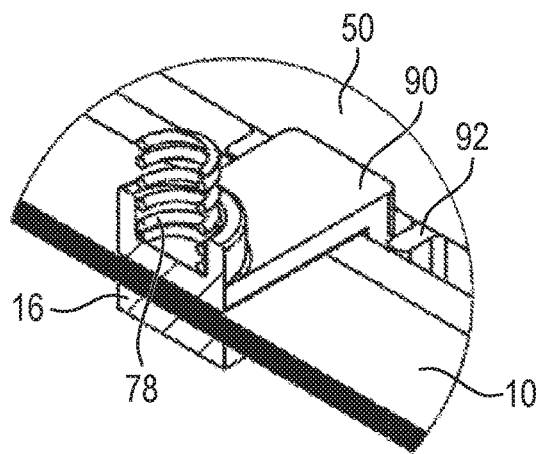
FIG. 24 shows detail XXIV of FIG. 23 on an enlarged scale.

FIGS. 22 to 24 show a fourth embodiment.

The same reference numbers are used for the components known from the preceding embodiments, and reference is made to the above discussions in this respect.

With regard to the arrangement of the mounting plate 70 and the arrangement of the spring element 78, the fourth embodiment corresponds to the third embodiment. The difference from the third embodiment consists in that the spring element 78 is supported against a slide 90 which is laterally guided in a slide guide 92 mounted on the holding part 50. The slide 90 engages completely around the multilayer composite structure 10, so that the latter is guided in the lateral direction. Here, the slide has such a width in the lateral direction that the (slight) increase in the width of the composite structure transversely to the longitudinal direction can be accommodated. As a result, the composite structure is held level even in the deflected state.

The bottom side of the slide 90 facing away from the spring element 78 may be used directly as an exposed load application member 16 here.

Figure 25:
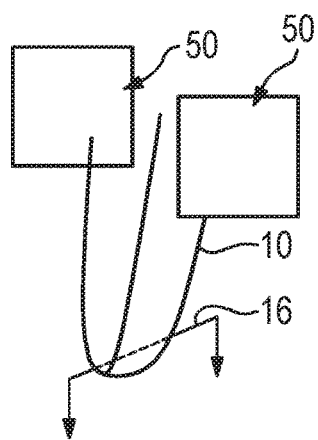
FIG. 25 shows a schematic view of a film transducer according to a fifth embodiment of the invention.
Figure 26:
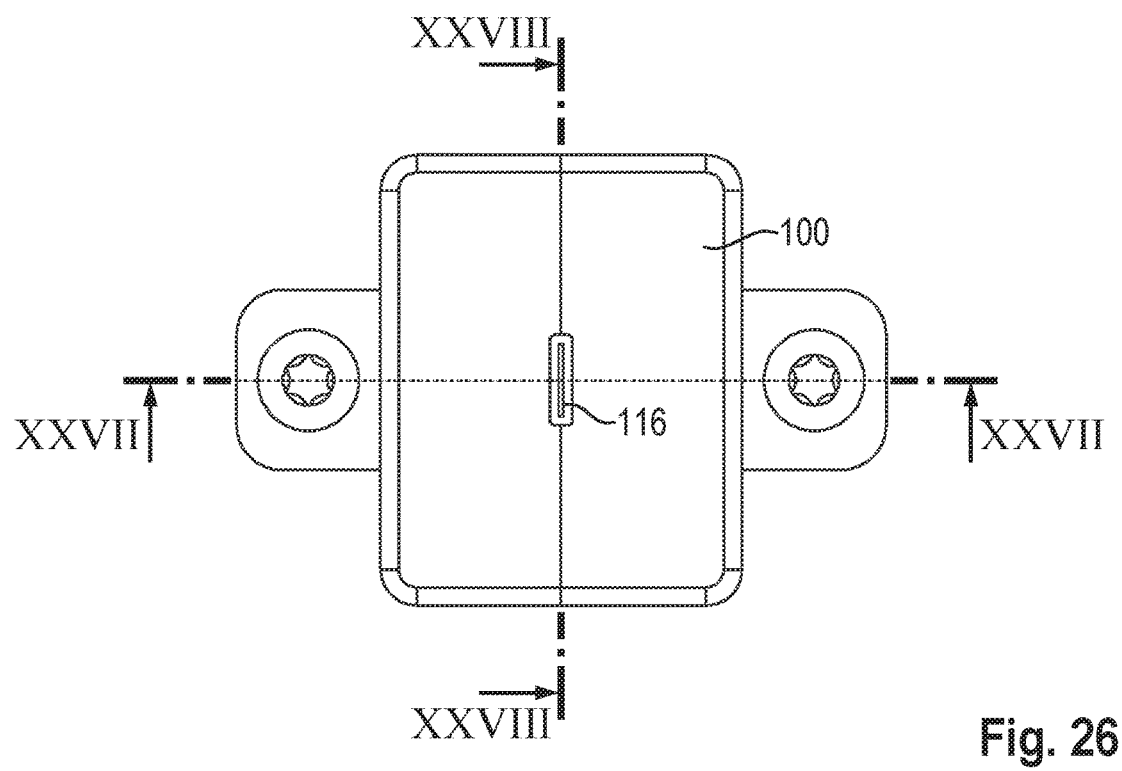
FIG. 26 shows a top view of a valve with a film transducer according to a sixth embodiment of the invention.
Figure 30:
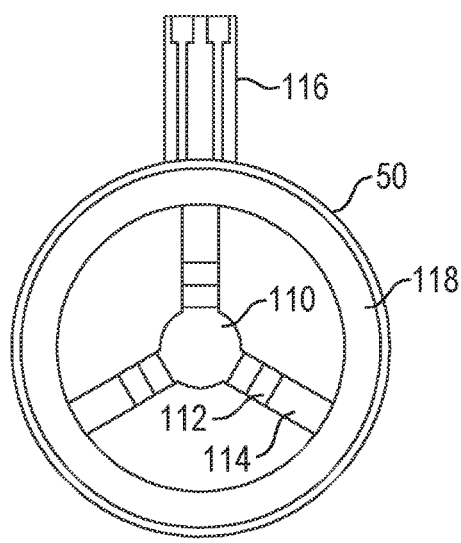
FIG. 30 shows a top view of the film transducer according to the sixth embodiment.
Figure 31:
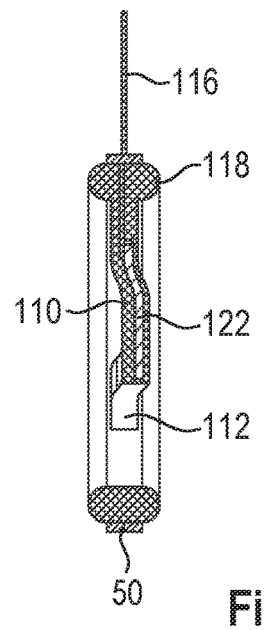
FIG. 31 shows a sectional view of the film transducer of FIG. 30.
Figure 32:
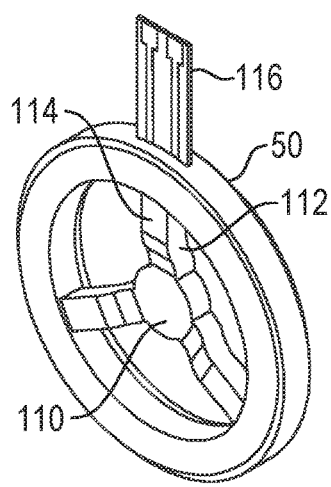
FIG. 32 shows a perspective view of the film transducer of FIG. 30.
Figure 33:
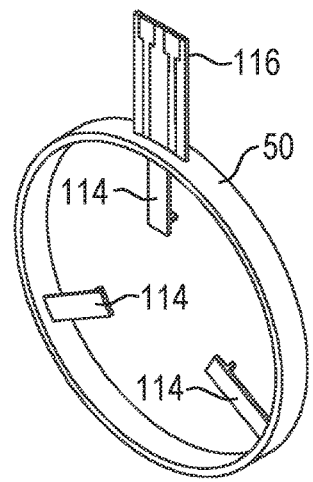
FIG. 33 shows a perspective view of a frame of the film transducer of FIG. 30.
Figure 34:
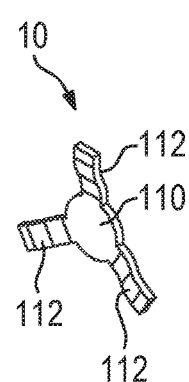
FIG. 34 shows a perspective view of the multilayer composite structure for the film transducer of FIG. 30.

FIG. 25 shows a film transducer according to a fifth embodiment. The same reference numbers are used for the components known from the preceding embodiments, and reference is made to the above discussions in this respect.

The essential difference between the fifth embodiment and, for example, the third embodiment illustrated in FIGS. 18 to 21 consists in that in the fifth embodiment the multilayer composite structure 10 is not held taut in the holding part 50 in the initial state, but sags, similar to a loop. A load application member 16 then engages the loop at the vertex. Due to the load application member 16, the multilayer composite structure 10, in practice, does not loosely sag, but is held taut.

As a result of the loop-shaped arrangement of the multilayer composite structure 10 relative to the direction of adjustment, the direction of expansion of the dielectric film material coincides with the stroke direction, allowing larger strokes to be realized. A further advantage resides in that this geometry makes narrower designs possible, for example a narrower actuating mechanism for a valve. The overall width is often more important than the overall height in these applications. A further advantage of the embodiment shown in FIG. 25 resides in that the actuator length, which is almost doubled, makes approximately twice the force available.

FIGS. 26 to 29 show a valve 100 in which a film transducer according to a sixth embodiment of the invention is used. The same reference numbers are used for the components known from the preceding embodiments, and reference is made to the above discussions in this respect.

The valve 100 includes a media inflow 102 and a media outflow 104. The media inflow 102 opens into a valve chamber 106 in a valve seat 108. The valve seat 108 has a film transducer according to the sixth embodiment associated with it, which is shown in detail in FIGS. 30 to 34.

If the ports 102, 104 are connected reversely, it is basically possible to use the port 104 as a media inlet as well.

The essential difference between the sixth embodiment and the preceding embodiments consists in that in the sixth embodiment the multilayer composite structure 10 is not configured as a continuously elongated strip, but an actuating section 110 is provided at the center thereof. In the exemplary embodiment shown, three strip actuators 112 extend starting from the actuating section 110 (see in particular FIG. 34) which are arranged at equal angular distances from each other. The multilayer composite structure 10 thus notionally contains three actuator strips each of which comprises two strip actuators 112 arranged at an angle to each other and the actuating section 110 located in between.

The holding part 50 is in the form of a circular ring here, starting from which three mounting arms 114 extend into the interior. The three strip actuators 112 are both mechanically fastened thereto and electrically contacted therewith. The actuating energy is supplied by means of a contact tab 116 extending outward from the holding element 50.

The actuating section 110 is preferably made from the same elastic material here as the carrier of each strip actuator 112. As an alternative, it is conceivable to produce the strip actuators 112 separately and then to connect them firmly to the actuating section 110.

Each of the strip actuators 112 is built up with a plurality of alternating layers of carriers and electrodes in the same way as in the preceding embodiments.

A sealing ring 118 that is associated with the holding part 50 is made from the same material as the carrier or from a different elastic material. The sealing ring 118 is made use of for arranging the film transducer in a sealed manner between two housing halves 120A, 120B which, when fitted together, constitute the housing of the valve 100.

When the film actuator is arranged between the two housing halves 120A, 120B, the actuating section 110 is associated with the valve seat 108. In the non-energized initial state (see FIG. 27), the actuating section 110 closes the valve seat 108.

If higher closing forces are required, a spring element may additionally be used which is arranged on the side facing away from the valve seat 108 and presses the actuating section 110 against the valve seat 108.

In the activated state, the strip actuators 112 become longer, so that the actuating section 110 can be lifted off the valve seat 108. If no valve element is used, the actuating section 110 will be lifted off the valve seat 108 solely as a result of the strip actuators 112 becoming longer in the activated state. If, however, a spring element is used for increasing the closing force, the media pressure is required to overcome the spring force for the actuating section 110 to be lifted off the valve seat 108.

In the area of the actuating section 110 an insert element 122 may be used which is made from a material having a higher hardness than the material that is used for the strip actuators 112. In particular, the insert 122 may be inherently stable.

Figure 35:
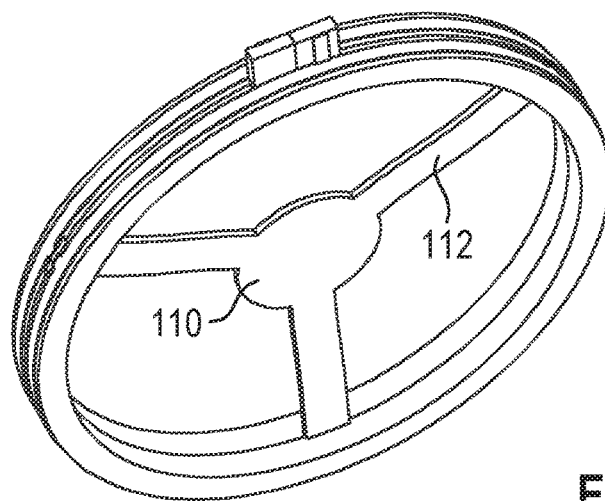
FIG. 35 shows a perspective view of a variant of the film transducer according to the sixth embodiment.
Figure 36:
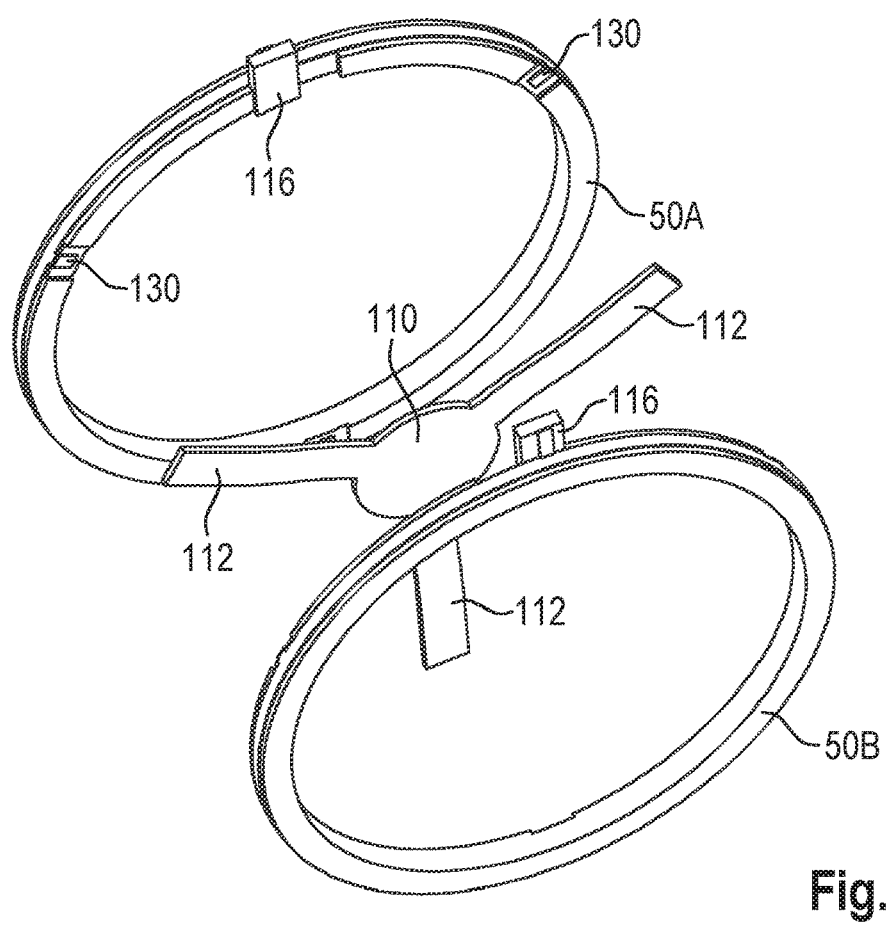
FIG. 36 shows an exploded view of the film transducer of FIG. 35.

FIGS. 35 and 36 show a variant embodiment of the film transducer known from FIGS. 30 to 34. The difference consists in that here the strip actuators 112 are designed to be so long that they extend as far as to the holding element 50. The latter is made up of two individual rings 50A, 50B here, between which the radially outer ends of the strip actuators 112 are clamped when they are fitted together to form a holding element 50. Each ring 50A, 50B has suitable contacts 130 provided therein by means of which the associated electrodes of the strip actuators 112 can be contacted.

In all of the embodiments of the film transducer, an elastically deformable insulating layer may be applied onto the electrode.

The insulating layer may be applied by chemical vapor deposition.

The insulating layer may be laminated onto the electrode.

The insulating layer may be a printed component which has been applied in particular by screen printing processes, pad printing processes or 3D printing processes.

The hardness of the insulating layer is lower than the hardness of the composite structure.

The insulating layer consists of silicone, acrylate or PU.

Particular embodiments of the invention further provide a digital storage medium comprising a 3D model, adapted to cooperate with a programmable computer system and a 3D printer such that a film transducer of the invention is produced.

Another particular embodiment provides a digital storage medium comprising a 3D model, adapted to be read out, of an actuator strip of the invention, the 3D model being adapted to cooperate with a programmable computer system and a 3D printer such that the actuator strip is produced.

What is claimed:

1. A film transducer comprising a holding part, an electroactive multilayer composite structure including at least two deformable carriers which are each coated on at least one side with a planar electrode, the multilayer composite structure having an elongated basic shape and being clamped on its shorter sides in a fixing section in the holding part while its longer sides are free, the electrodes of the multilayer composite structure being alternately connected at the ends of the deformable carriers clamped in the holding part to a contact element which is arranged in the fixing section, wherein the holding part is attached to a mounting plate and a spring element is arranged between the mounting plate and a load application member.

2. The film transducer of claim 1 wherein the fixing section has a spring element arranged therein by which the ends of the multilayer composite structure that are clamped in said fixing section are pressed together.

3. The film transducer of claim 1 wherein the contact element is a contact blade inserted in a recess in the holding part.

4. The film transducer of claim 1 wherein the electrodes are contacted alternately in one fixing section of the holding part and in another fixing section on opposite side of the holding part.

5. The film transducer of claim 1 wherein the ends of the multilayer composite structure which are clamped in the fixing section of the holding part are bent as compared to their direction of extent between the two fixing sections.

6. The film transducer of claim 5 wherein the electrode is arranged on that side of the carrier which, after the bending process, is associated with the contact element.

7. The film transducer of claim 1 wherein the electrodes extend as far as to the edge of the carrier at one end of the multilayer composite structure and terminate at a distance from the edge at the opposite end.

8. The film transducer of claim 1 wherein the carriers are provided with a contact tongue which is coated with the electrode.

9. The film transducer of claim 8 wherein, in a top view, the contact tongues are arranged in a stepped configuration.

10. The film transducer of claim 1 wherein the carriers of the multilayer composite structure have different lengths and are layered such that their ends, in a top view, are arranged in a stepped configuration.

11. The film transducer of claim 1 wherein the electrodes are provided with a contact tab which is contacted in the associated fixing section.

12. The film transducer of claim 11 wherein the contact tabs are soldered to each other.

13. The film transducer of claim 1 wherein a conductive adhesive is provided by which the electrodes are electrically conductively bonded to each other.

14. The film transducer of claim 1 wherein an electronic circuit is provided which is connected to the contact elements.

15. The film transducer of claim 14 wherein the electronic circuit is integrated in the holding part.

16. The film transducer of claim 1 wherein an electronic circuit is provided which is connected to the contact elements, the electronic circuit being attached to or integrated in the mounting plate.

17. The film transducer of claim 1 wherein the multilayer composite structure is coupled to a load application member between the fixing sections.

18. The film transducer of claim 10 wherein the load application member is a plate.

19. The film transducer of claim 10 wherein the load application member is a tappet.

20. The film transducer of claim 19 wherein the tappet extends through the mounting plate and through the spring element.

21. The film transducer of claim 10 wherein the load application member is a cup-shaped tappet in which the spring element is arranged.

22. The film transducer of claim 10 wherein the load application member is a slide which is displaceably guided in the holding part and against which the spring element is supported.

23. The film transducer of claim 1 wherein the holding part consists of a material which has a higher hardness than the multilayer composite structure.

24. The film transducer of claim 1 wherein the carriers consist of a dielectric material.

25. The film transducer of claim 24 wherein the carriers are a sheet or a film made from a dielectric polymer.

26. The film transducer of claim 24 wherein the dielectric material is a printed component which has been produced as a thin film by screen printing processes, pad printing processes, 3D printing processes.

27. The film transducer of claim 24 wherein the dielectric material is a cast component.

28. The film transducer of claim 1 wherein the electrodes consist of a mixture of a matrix material, a conductive material, solvents and additives.

29. The film transducer of claim 28 wherein the matrix material is an elastomer material.

30. The film transducer of claim 28 wherein the conductive material is soot, carbon nanotubes, conductive polymers, nanowires or a mixture of these materials.

31. The film transducer of claim 1 wherein the electrodes are a printed component which has been applied as a thin layer by screen printing processes, pad printing processes, 3D printing processes, lamination, inkjet printing processes or aerosol jet processes.

32. The film transducer of claim 1 wherein the electrode is bonded to the carrier.

33. The film transducer of claim 1 for converting electrical energy to mechanical work.

34. The film transducer of claim 1 for converting mechanical to electrical energy.

35. The film transducer of claim 1 wherein the holding part is a printed component.

36. The film transducer of claim 35 wherein the holding part has been printed by screen printing processes, pad printing processes or 3D printing processes.

37. The film transducer of claim 1 wherein the holding part is an injection molded part.

38. The film transducer of claim 1 wherein the holding part consists of an epoxy resin.

39. The film transducer of claim 1 wherein the multilayer composite structure is tautly mounted in the holding part, so that the multilayer composite structure carries out a stroke which is substantially perpendicular to its direction of extent and thus also perpendicular to its direction of expansion.

40. The film transducer of claim 1 wherein the holding part comprises two fixing sections and the multilayer composite structure is held between the two fixing sections of the holding part and extends away from a plane that runs through the two fixing sections.

41. The film transducer of claim 1 wherein an actuating section is provided in the center of the multilayer composite structure.

42. The film transducer of claim 41 wherein the actuating section is free of electrodes.

43. The film transducer of claim 41 wherein the holding part is a ring.

44. The film transducer of claim 41 wherein the multilayer composite structure has a star shape.

45. An actuator strip for the film transducer of claim 1, comprising a carrier which consists of an elastically deformable plastic film and, in a top view, has a generally elongated shape, and a planar electrode which is firmly connected to the carrier and forms a contacting section on one of the two shorter side edges of the carrier.

46. The actuator strip of claim 45 wherein the contacting section is a contact tab projecting in the longitudinal direction.

47. The actuator strip of claim 45 wherein the contacting section is a contact tongue which is electrically conductively connected to the electrode.

48. The actuator strip of claim 45 wherein the carrier consists of a dielectric polymer.

49. The actuator strip of claim 45 wherein the electrode consists of an elastic, electrically conductive plastic.

50. The actuator strip of claim 45 wherein, in a top view, it has a rectangular shape having a length that amounts to at least twice the width.

51. A digital storage medium comprising a 3D model, adapted to be read out, of the film transducer as is defined in claim 1, the 3D model being adapted to cooperate with a programmable computer system and a 3D printer such that the film transducer is produced.

52. A digital storage medium comprising a 3D model, adapted to be read out, of the actuator strip as is defined in claim 45, the 3D model being adapted to cooperate with a programmable computer system and a 3D printer such that the actuator strip is produced.

53. The film transducer of claim 28 wherein the matrix material is an elastomer material.

54. The film transducer of claim 28 wherein the conductive material is soot, carbon nanotubes, conductive polymers, nanowires or a mixture of these materials.

55. A film transducer comprising a holding part, an electroactive multilayer composite structure including at least two deformable carriers which are each coated on at least one side with a planar electrode, the multilayer composite structure having an elongated basic shape and being clamped on its shorter sides in a fixing section in the holding part while its longer sides are free, the electrodes of the multilayer composite structure being alternately connected at the ends of the deformable carriers clamped in the holding part to a contact element which is arranged in the fixing section wherein the electrodes consist of a mixture of a matrix material, a conductive material, solvents and additives.

56. A film transducer comprising a holding part, an electroactive multilayer composite structure including at least two deformable carriers which are each coated on at least one side with a planar electrode, the multilayer composite structure having an elongated basic shape and being clamped on its shorter sides in a fixing section in the holding part while its longer sides are free, the electrodes of the multilayer composite structure being alternately connected at the ends of the deformable carriers clamped in the holding part to a contact element which is arranged in the fixing section wherein the electrodes are a printed component which has been applied as a thin layer by screen printing processes, pad printing processes, 3D printing processes, lamination, inkjet printing processes or aerosol jet processes.

* * * * *